United States Patent
Zhou et al.

(10) Patent No.: US 7,891,411 B2
(45) Date of Patent: Feb. 22, 2011

(54) HEAT DISSIPATION DEVICE HAVING A FAN FOR DISSIPATING HEAT GENERATED BY AT LEAST TWO ELECTRONIC COMPONENTS

(75) Inventors: Shi-Wen Zhou, Shenzhen (CN); Peng Liu, Shenzhen (CN); Jun Cao, Shenzhen (CN)

(73) Assignees: Fu Zhun Precision Industry (Shen Zhen) Co., Ltd., Shenzhen, Guangdong Province (CN); Foxconn Technology Co., Ltd., Tucheng, Taipei County (TW)

( * ) Notice: Subject to any disclaimer, the term of this patent is extended or adjusted under 35 U.S.C. 154(b) by 888 days.

(21) Appl. No.: 11/767,032

(22) Filed: Jun. 22, 2007

(65) Prior Publication Data

US 2008/0314556 A1  Dec. 25, 2008

(51) Int. Cl.
*F28F 7/00* (2006.01)
*H05K 7/20* (2006.01)

(52) U.S. Cl. .................. 165/80.3; 165/104.21; 165/121
(58) Field of Classification Search ................ 165/80.3, 165/104.34, 121, 122, 104.21, 104.33; 361/695, 361/697, 700; 257/715
See application file for complete search history.

(56) References Cited

U.S. PATENT DOCUMENTS

| | | | |
|---|---|---|---|
| 5,331,510 A | | 7/1994 | Ouchi et al. |
| 6,102,110 A | * | 8/2000 | Julien et al. ............ 165/104.33 |
| 6,189,601 B1 | * | 2/2001 | Goodman et al. ........... 165/80.3 |
| 6,304,445 B1 | * | 10/2001 | Bollesen ..................... 361/697 |
| 7,304,845 B2 | * | 12/2007 | Xia et al. .................... 361/697 |
| 7,447,020 B2 | * | 11/2008 | Xia et al. .................... 361/695 |
| 7,478,668 B2 | * | 1/2009 | Chen et al. ............. 165/104.33 |
| 7,646,604 B2 | * | 1/2010 | Cao et al. .................... 361/697 |
| 2002/0179285 A1 | * | 12/2002 | Sas et al. .................... 165/80.3 |
| 2004/0226697 A1 | * | 11/2004 | Liu ........................ 165/104.33 |
| 2005/0082041 A1 | * | 4/2005 | Chen et al. ............. 165/104.33 |

FOREIGN PATENT DOCUMENTS

| | | |
|---|---|---|
| CN | 1624909 A | 6/2005 |
| CN | 2792116 Y | 6/2006 |
| CN | 2843009 Y | 11/2006 |
| TW | M288400 | 3/2006 |
| TW | M291559 | 6/2006 |

* cited by examiner

*Primary Examiner*—Tho v Duong
(74) *Attorney, Agent, or Firm*—Jeffrey T. Knapp (57) ABSTRACT

A heat dissipation device for at least two heat-generating electronic components, includes a base, a fin set and a plurality of heat pipes. The base includes a supporting frame and at least two plates attached to a bottom of the frame for contacting with the at least two heat-generating electronic components. The fin set includes a plurality of fins on the base. The heat pipes respectively and thermally connect the at least two plates and the fin set together. A single fan is attached to the heat dissipation device for generating an airflow through the fin set to dissipate heat in the fin set absorbed from the at least two heat-generating electronic components.

16 Claims, 7 Drawing Sheets

HEAT DISSIPATION DEVICE HAVING A FAN FOR DISSIPATING HEAT GENERATED BY AT LEAST TWO ELECTRONIC COMPONENTS

BACKGROUND OF THE INVENTION

1. Field of the Invention

The present invention relates generally to a heat dissipation device, and more particularly to a heat dissipation device having a heat sink and a fan holder for facilitating mounting a fan on the heat sink, wherein the heat sink simultaneously contacts with at least two heat-generating electronic components, and the fan generates an airflow through the heat sink to dissipate heat of the heat sink absorbed from the at least two heat-generating electronic components.

2. Description of Related Art

Electronic component includes numerous circuits operating at high speed and generating substantive heat. In many applications, it is desirable to employ a heat sink to remove heat from heat-generating electronic components, such as central processing units (CPUs), to assure that the components function properly and reliably. A typical heat sink comprises a base for contacting with the heat-generating component to absorb the heat generated by the heat-generating component and a plurality of parallel planar fins attached to the base by soldering or adhering. Alternatively, the fins can be integrally formed with the base by metal extrusion, such as aluminum extrusion. The fins are used for dissipating the heat to ambient air.

With the development of various types of electronic modules, an array of many discrete heat-generating components may be mounted to a surface of a single circuit board. In some circumstances, more than one of the components must be cooled. A conventional thermal resolution is to provide each of the discrete heat-generating components with an individual heat sink. However, with development of electronic technology, electronic products and systems are required to become more and more compact and portable in configuration. As a result, spacing between the heat-generating components decrease dramatically, which obviously restricts sizes and efficiency of the individual heat sinks. Additionally, it is both expensive and time-consuming to attach separate heat sinks to the heat-generating components one by one.

What is needed therefore is a heat dissipation device with an improved structure, which is able to simultaneously cool at least two heat-generating components.

SUMMARY OF THE INVENTION

The present invention relates to a heat dissipation device for simultaneously dissipating heat generated by at least two heat-generating electronic components. The heat dissipation device includes a base, a fin set and at least two groups of heat pipes. The base includes a supporting frame and at least two plates attached to a bottom of the frame for contacting with the at least two heat-generating electronic components. The fin set includes a plurality of fins on the base. The at least two groups of heat pipes respectively and thermally connect the at least two plates and the fin set together. A fan holder on which a fan is mounted is attached to the heat dissipation device. An airflow generated by the fan flows through the fin set to dissipate heat of fin set absorbed from the at least two heat-generating electronic components.

Other advantages and novel features of the present invention will become more apparent from the following detailed description of preferred embodiment when taken in conjunction with the accompanying drawings, in which:

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Referring to FIGS. 1-4, a heat dissipation device in accordance with a preferred embodiment of the present invention is shown. The heat dissipation device is mounted to two heat-generating electronic elements (not shown), to dissipate heat therefrom. The heat dissipation device comprises a heat sink, a fan holder 50 secured on the heat sink and a fan 60 attached to the fan holder 50.

The heat sink comprises a base 10, a fin set 30 standing on the base 10, a heat pipe assembly 20 thermally connecting the base 10 and the fin set 30 and a fin cover 40 covering top and opposite lateral sides of the fin set 30.

Figure 5:
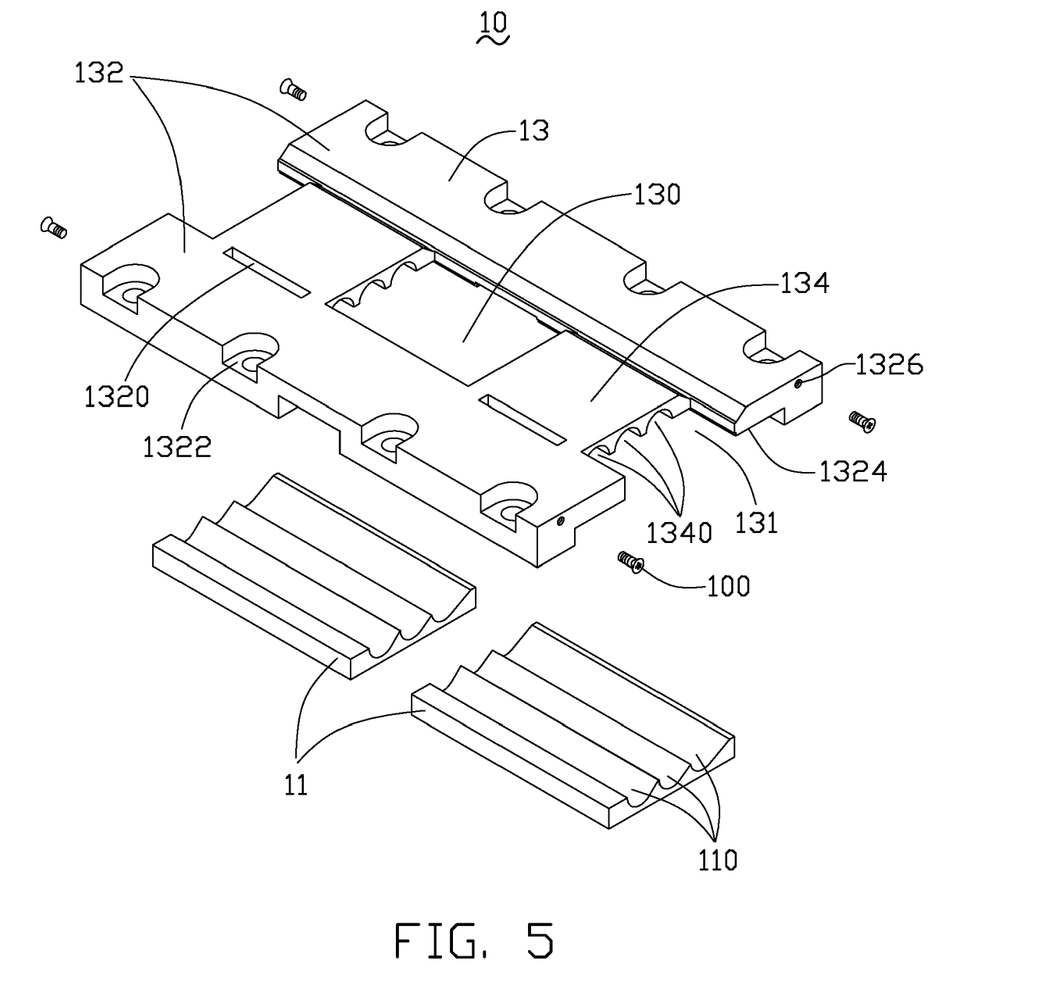
FIG. 5 is an isometric view of a base of the heat dissipation device of FIG. 4.

As shown in FIG. 5, the base 10 comprises a supporting frame 13 and two plates 11 attached to a bottom of the supporting frame 13 for contacting with the two corresponding heat-generating electronic elements. Each of the plates 11 which is made of a good heat conductive material such as copper, is rectangular in shaped and defines three parallel receiving grooves 110 in a top surface thereof. The supporting frame 13 comprises two spaced and parallel shoulders 132 and two spaced and parallel bridges 134 connecting the two shoulders 132 together. Two fixing slots 1320 parallel to the shoulders 13 are defined in two joints of the two bridges 134 with one of the shoulders 132 for engaging with the fan holder 50. A plurality of countersinks 1322 are defined in a top surface of the two shoulders 132, adjacent to two remote edges thereof, for receiving fixtures (not labeled) to attach the heat sink onto the heat-generating electronic elements. The two shoulders 132 are respectively provided with two step portions 1324 that face to each other at a bottom surface thereof, for forming a receiving space (not labeled) to accommodate the plates 11 therein. Each of the shoulders 132 defines two mounting orifices 1326 in two opposite lateral ends thereof, respectively, for engaging with screws 100 to secure the fin cover 40 to the base 10. The two bridges 134 define a rectangular opening 130 therebetween. Two cutoffs 131 are defined beside the bridges 134, respectively, and between the two shoulders 132. Each of the bridges 134 defines three parallel receiving grooves 1340 in a bottom surface thereof corresponding to the receiving grooves 110 of each of the plates 11.

Figure 4:
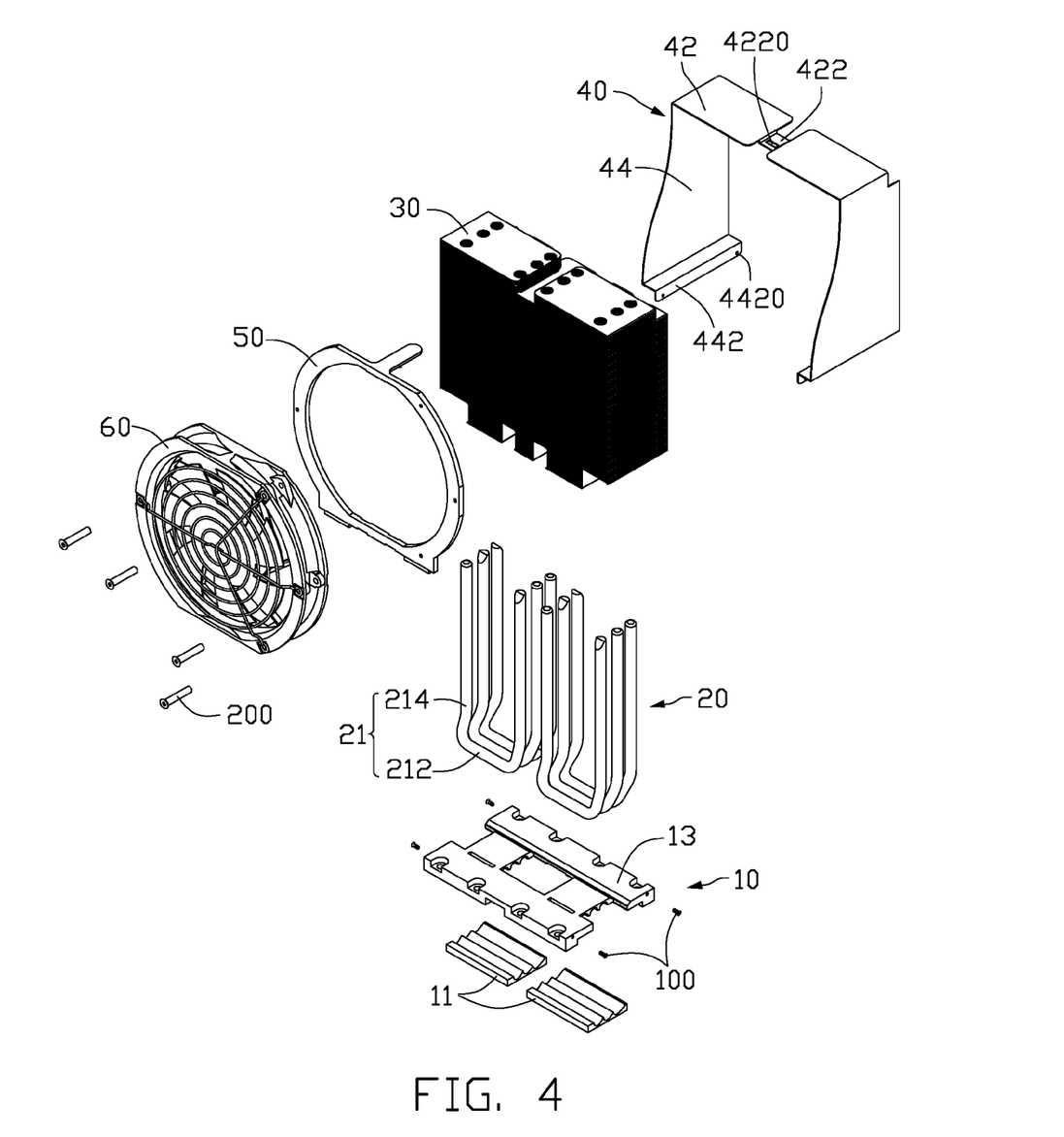
FIG. 4 is an exploded, isometric view of the heat dissipation device of FIG. 1.

As shown in FIG. 4, the heat pipe assembly 20 includes two groups each having three heat pipes 21. Each of the heat pipes 21 is U-shaped in profile and comprises an evaporating section 212, two parallel condensing sections 214 perpendicular to the evaporating section 212, and two curved connecting sections (not labeled) extending from two opposite ends of the evaporating section 212 and connecting the evaporating section 212 with the condensing sections 214.

Figure 6:
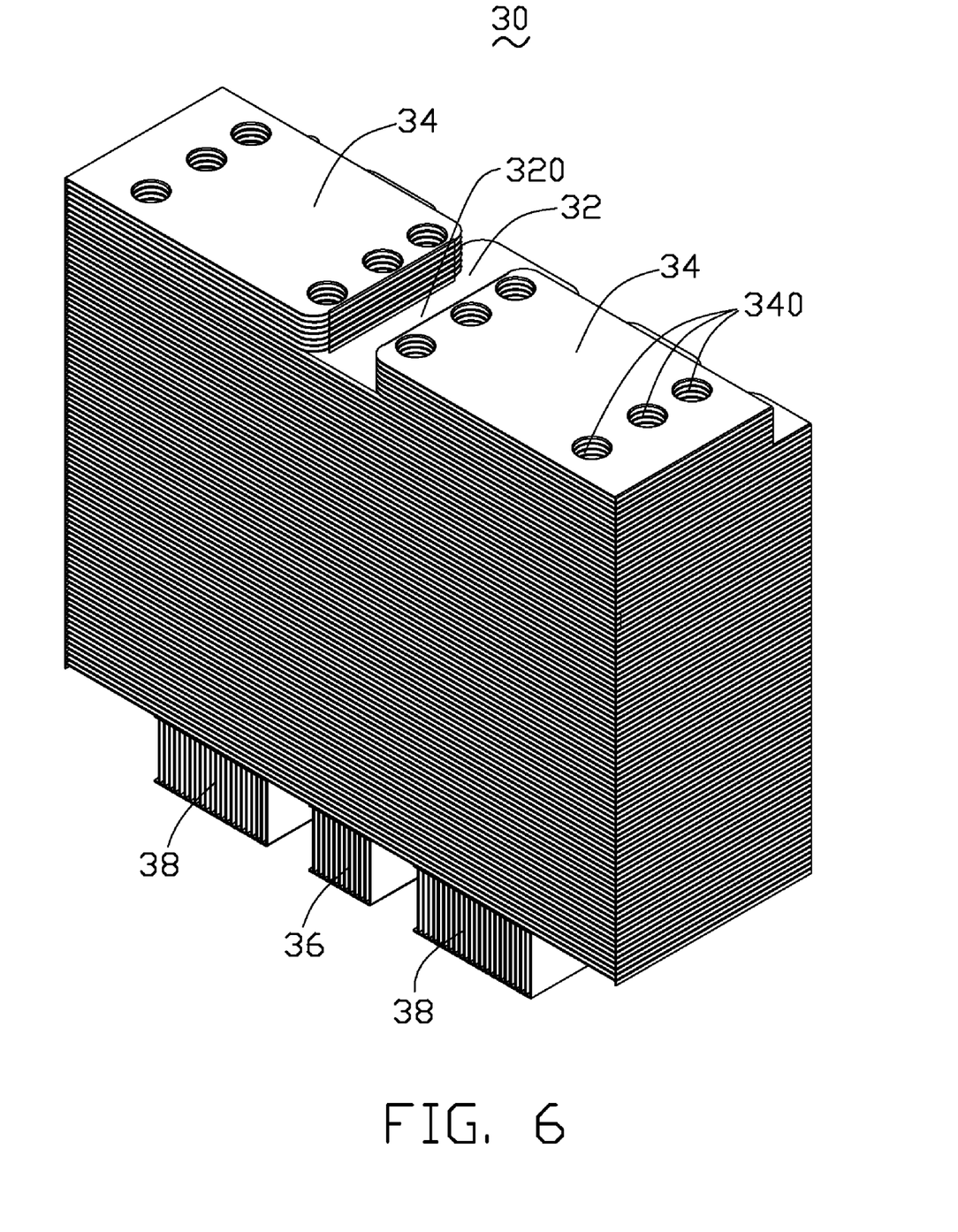
FIG. 6 is an isometric view of a fin set of the heat dissipation device of FIG. 4.

As shown in FIG. 6, the fin set 30 comprises a plurality of fins 32 arranged horizontally and defines two platforms 34 at a top thereof. The two platforms 34 are spaced from each other and separated by an elongated recessing portion 322. The two platforms 34 each define two rows of receiving holes 340 adjacent to two ends thereof, for receiving the condensing sections 214 of one group of the heat pipes 21 therein. Each of the rows has three receiving holes 340 vertically extending through the fin set 30 and perpendicular to the fins 32. The fin set 30 has a first supporting unit 36 and two second supporting units 38 at bottom thereof. The first supporting unit 36 is located between and spaces from the two second supporting units 38 with predetermined distance. The two rows of the receiving holes 340 in the fin set 30 at two opposite edges of each of the platforms 34 are spaced from each other a distance slightly larger than a width of the second supporting unit 38. The two neighboring rows of the receiving holes 340 beside the recessing portion 322 are spaced from each other a distance slightly larger than a width of the first supporting unit 36. The first and second supporting units 36, 38 comprise a plurality of rectangular metallic, thin sheets (not labeled) perpendicular to the fins 32. The sheets of the first and second supporting units 36, 38 have flanges (not labeled) extending perpendicularly from lower and upper edges thereof. These flanges cooperatively form an upper contacting surface attached to a bottom surface of a bottom one of the fins 32 and a lower contacting surface standing on the base 10. The first supporting unit 36 projects rearwards beyond the two second supporting units 38 (shown in the FIG. 3).

As shown in FIG. 4 the fin cover 40 is integrally made of a piece of metal sheet and comprises a rectangular top panel 42 and two sidewalls 44 extending perpendicularly and downwardly from two lateral opposite edges of the top panel 42. The top panel 42 is provided with a connecting sheet 422 recessing downwardly from a top surface of the top panel 42. The connecting sheet 422 has a width less than that of other portion of the top panel 42 and defines a locking aperture 4220 therein, for engaging with the fan holder 50. Due to the recessing of the connecting sheet 422, the top panel 42 forms a concave portion therein. The two sidewalls 44 are disposed snugly on two opposite lateral sides of the fin set 30. The two sidewalls 44 each have a width increasing gradually in a same direction from a top to a bottom thereof. A bottom end of each of the sidewalls 44 is bended inwardly and perpendicularly and then further downwardly and perpendicularly to form a mounting leg 442. Each of the mounting legs 442 defines two fixing orifices 4420 adjacent to two opposite ends thereof, for allowing the screws 100 to extend therethrough and screw into the mounting orifices 1326 of the base 10, whereby the sidewalls 44 are secured to the base 10.

Figure 1:
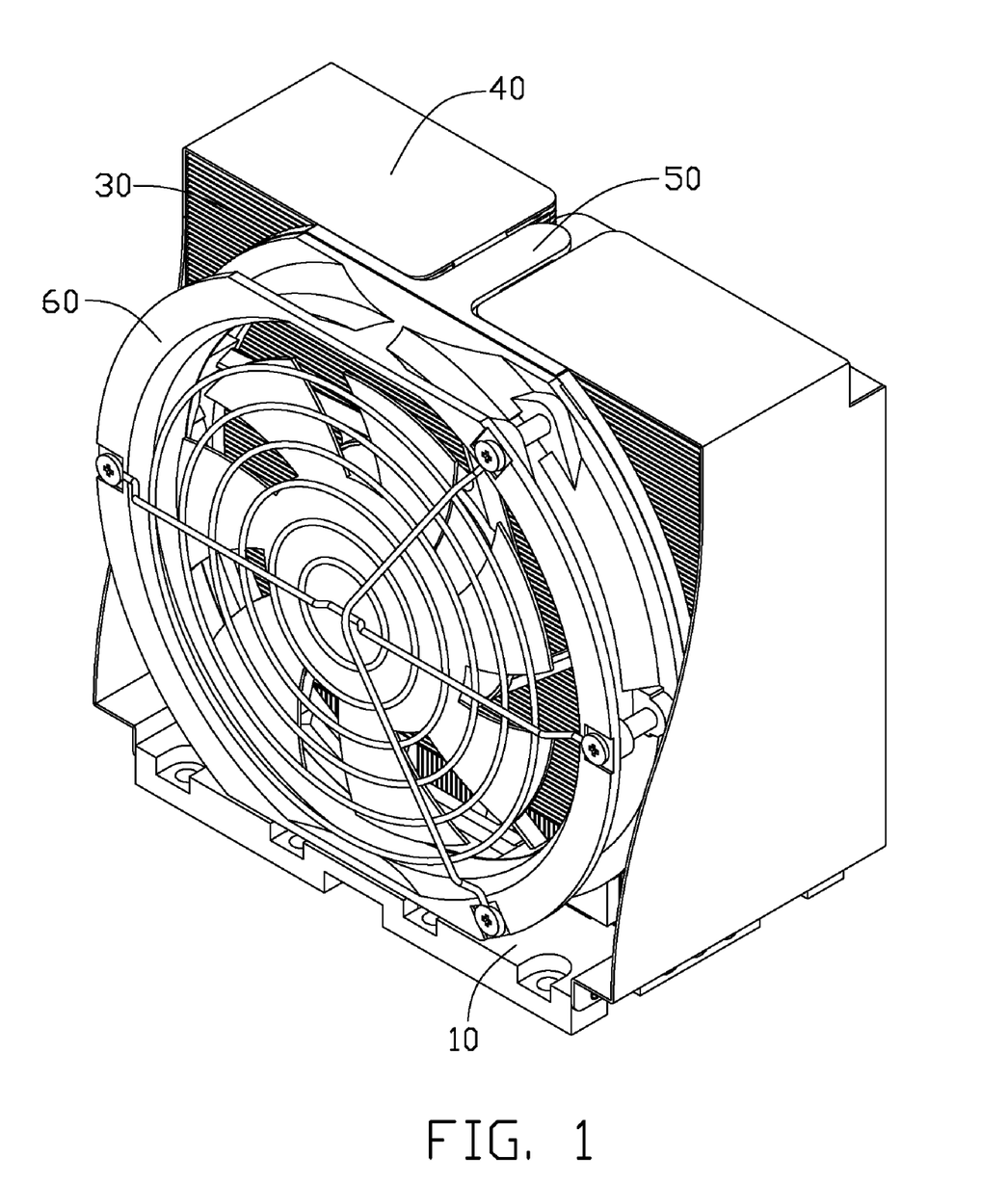
FIG. 1 is an assembled view of a heat dissipation device in accordance with a preferred embodiment of the present invention.
Figure 2:
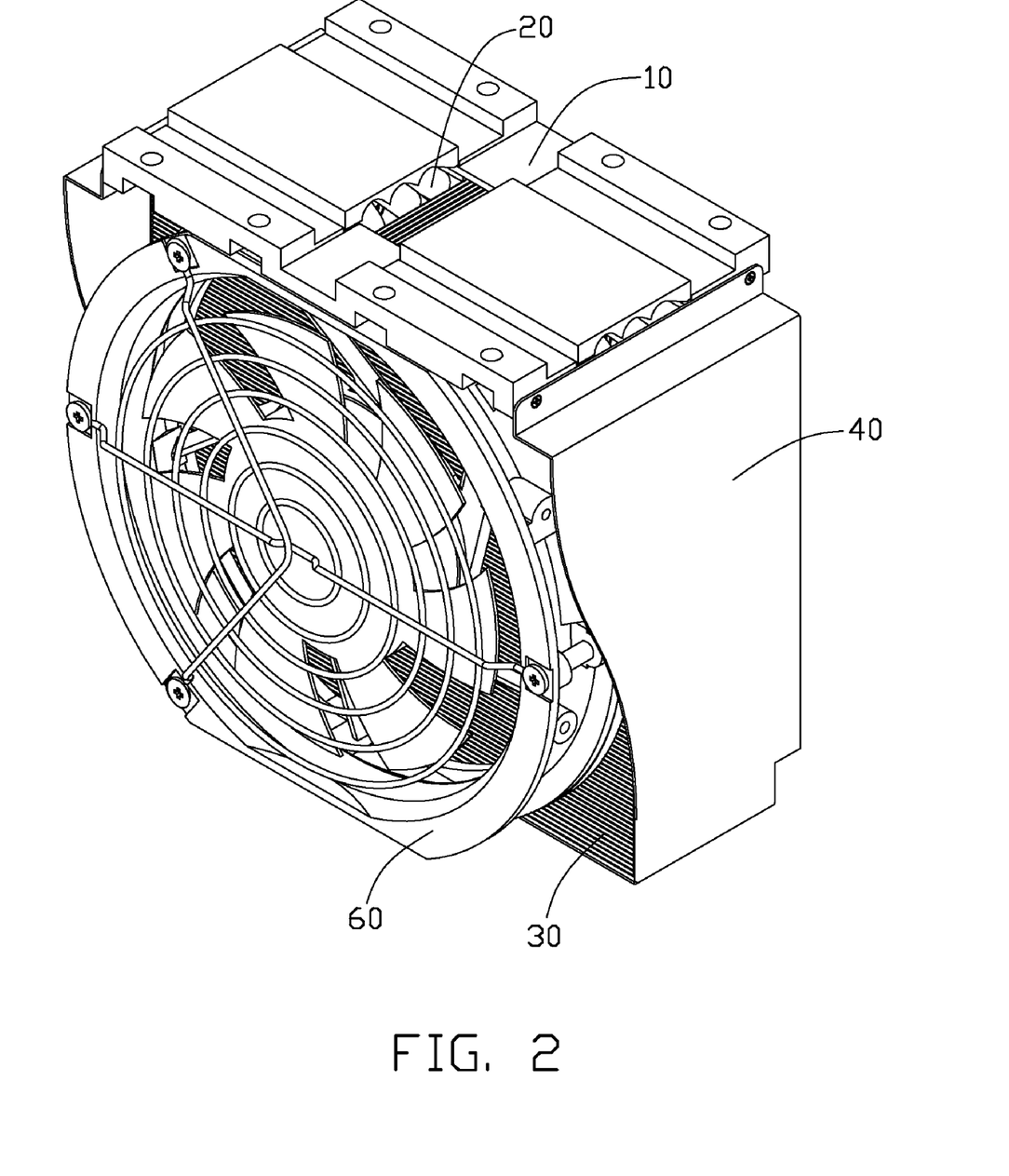
FIG. 2 is an inverted view of the heat dissipation device of FIG. 1
Figure 3:
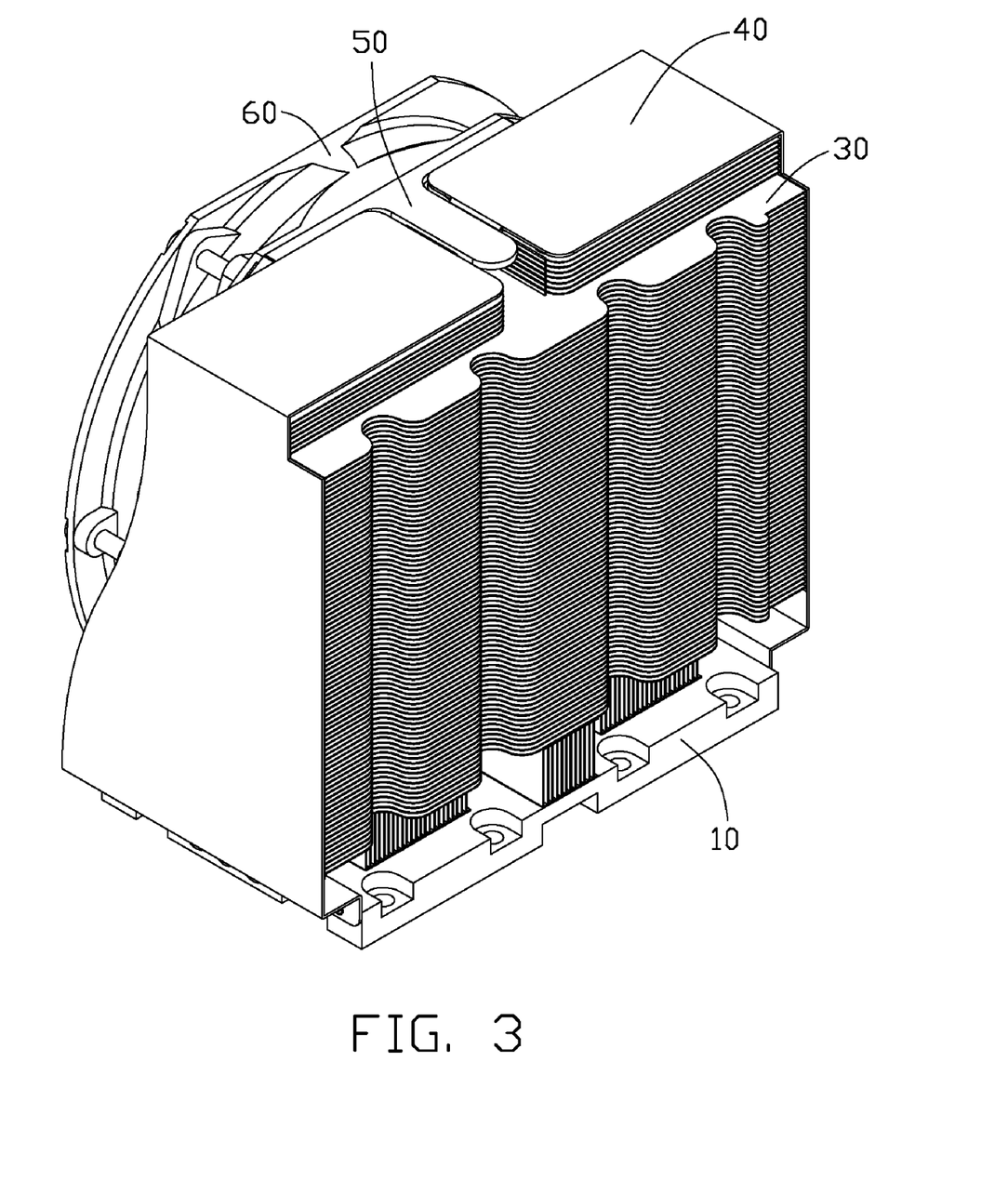
FIG. 3 is an assembled view of the heat dissipation device of FIG. 1 from another aspect.

Particularly referring to FIGS. 1 to 3, in assembly of the heat sink, the fin set 30 is soldered on the supporting frame 13 of the base 10, with the first supporting unit 36 sitting across a middle of the opening 130 and being soldered to two neighboring edges of the shoulders 130. The second supporting units 38 are soldered to the bridges 134, respectively. The evaporating sections 212 of the two groups of heat pipes 21 are sandwiched between the two plates 11 and the two bridges 134 of the supporting frame 13 and received respectively in channels defined cooperatively by the receiving grooves 110, 1340 of the two plates 11 and the bridges 134 of the supporting frame 13. The condensing sections 214 of the two groups of heat pipes 21 respectively pass through the opening 130 and cutoffs 131 of the supporting frame 13 and are engagingly received in the receiving holes 340 of the fin set 30; thus, the base 10 and fin set 30 are thermally connected together by the heat pipes 21. The fin cover 40 covers on the fin set 30 and is secured to the base 10 by the screws 100 extending through the fixing orifices 4420 of the mounting legs 442 of the sidewalls 44 and screwing in the mounting orifices 1326 of the base 10. The top panel 42 of the fin cover 40 is placed on the platforms 34 of the fin set 30 with the connecting sheet 422 received in the recessing portion 322 of the fin set 30.

Figure 7:
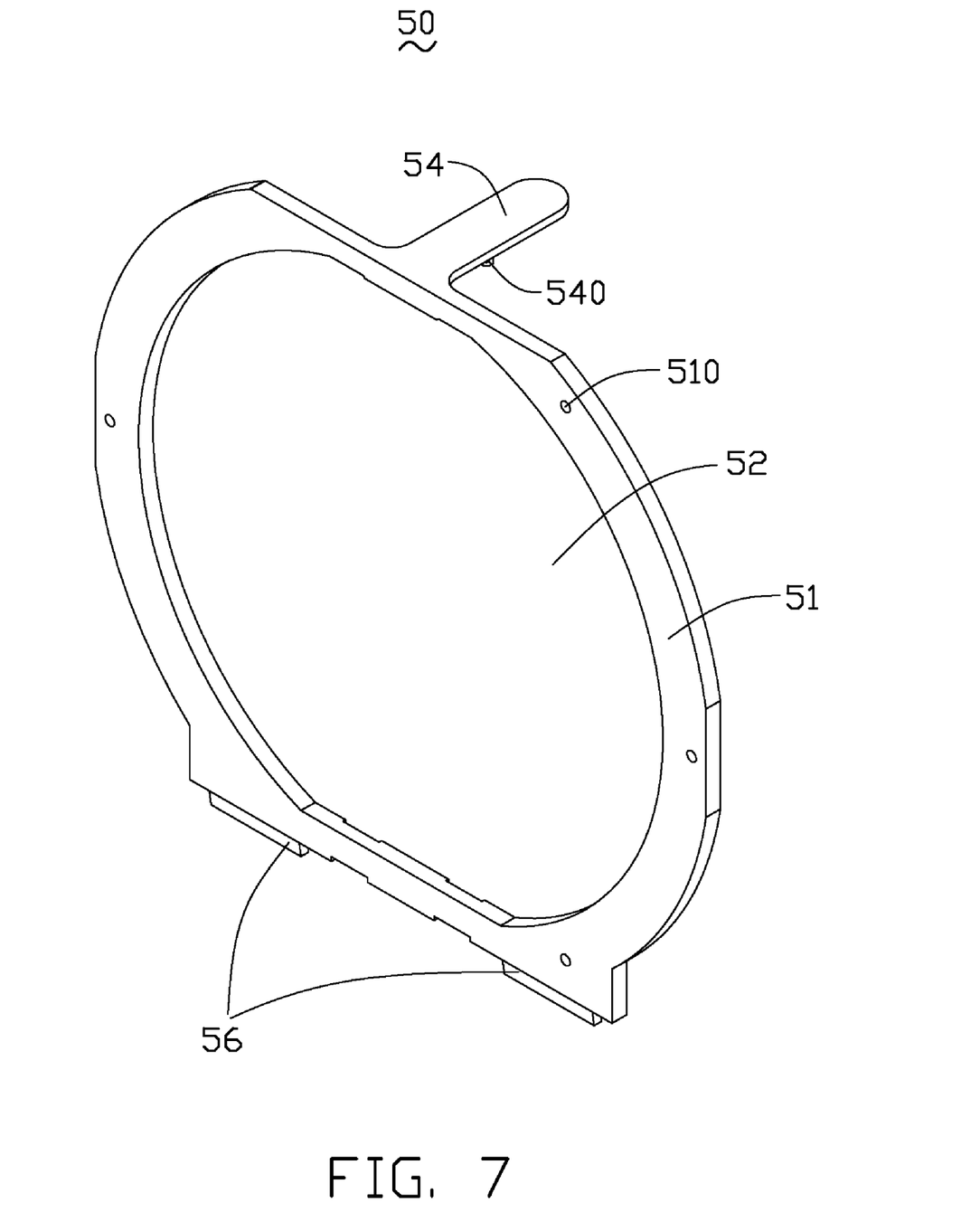
FIG. 7 is an isometric view of a fan holder of the heat dissipation device of FIG. 4.

As shown in FIG. 7, the fan holder 50 is formed by molded plastic material and substantially ring-shaped. The fan holder 50 has a ring body 51 with a through hole 52 therein for allowing airflow generated by the fan 60 to pass therethrough. The ring body 51 defines a plurality of engaging orifices 510 therein for engaging with corresponding fixtures 200, thereby attaching the fan 60 onto the fan holder 50. The fixtures 200 extend through holes (not labeled) defined in the fan 60 to engage in the engaging orifices 510 of the fan holder 50, thereby fixing the fan 60 to fan holder 50. The fan holder 50 is provided with a first engaging part at an upper edge of the ring body 51 and a second engaging part at a lower edge of the ring body 51 opposite to the upper edge. In this embodiment, the first engaging part is a fixing arm 54 that extending perpendicularly from a top of the ring body 51. The fixing arm 54 has a barb 540 extending downwardly from a middle of a bottom surface thereof and matching with the locking aperture 4220 of the fin cover 40. The second engaging part is two inhibiting tabs 56 protruding downwardly from a bottom of the ring body 51 for engaging into the fixing slots 1320 of the base 10.

As shown in FIG. 4, the fan 60 has a frame (not labeled) with a shape and size corresponding to that of the fan holder 50. The frame defines the plurality of holes (not labeled) corresponding to the engaging orifices 510 of the fan holder 50, for receiving the fixtures 200 therein.

In assembly of the heat dissipation device, the fan holder 50 and the fan 60 are assembled into a fan assembly by the fixtures 200 extending through the holes (not labeled) of the fan 60 to engage into the engaging orifices 510 of the fan holder 50. The fixing arm 54 of the fan holder 50 of the fan assembly is disposed in the concave portion of the fin cover 40 and supported by the connecting sheet 422 of the fin cover 40 with the barb 540 of the fixing arm 54 aligned with the locking orifice 4220 of the fin cover 40. The fan holder 50 of the fan assembly is then pressed downwardly to force the barb 540 of the fixing arm 54 to interferentially fit into the locking orifice 4220 of the fin cover 40. As soon as the barb 540 of the fixing arm 54 fits into the locking orifice 4220 of the fin cover 40, the barb 540 hooks with the connecting sheet 422 of the fin cover 40. When the barb 540 is engaged into the locking orifice 4220 of the fin cover 40, the two inhibiting tabs 56 at the bottom of the fan holder 50 of the fan assembly are forced to be engagingly inserted into the two fixing slots 1320 of the frame 13 of the base 10. The fan 60 combined with the fan holder 50 is thus mounted to the heat sink securely.

In use of the heat dissipation device, the heat generated by the two heat-generating electronic elements during operation is absorbed by the two plates 11 of the base 10; then the heat is transferred to the fin set 30 through the heat pipes 21 and the supporting frame 13; finally the heat is brought into ambient by the airflow from the fan 60 through the fin set 30.

Since the present invention uses a single fan to cool two heat-generating electronic components, the fan 60 can have a larger size in comparison with prior art, which uses two small fans to dissipate heat generated by the two electronic components. The fan with larger size can produce the same volumetric flow rate as the small fan when the large fan has a lower rotation speed. Accordingly, noise level generated by the large fan during operation is lower than that generated by the two small fans. Thus, the present invention can be operated more quietly, which is important in the present critical requirement regarding noise level of working and living environment.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device adapted for simultaneously dissipating heat from at least two heat-generating electronic components, comprising:
   a base comprising a supporting frame and at least two plates attached to a bottom of the frame for contacting the at least two heat-generating electronic components;
   a fin set comprising a plurality of fins on the base; and
   at least two groups of heat pipes respectively and thermally connecting the at least two plates and the fin set together;
   wherein the supporting frame comprises at least two spaced bridges, and defines at least one opening between the at least two bridges and two cutoffs beside the at least two bridges, respectively; and
   wherein each of the heat pipes is U-shaped in profile and comprises:
   an evaporating section sandwiched between one of the at least two plates and a corresponding bridge; and
   two condensing sections extending from two opposite ends of the evaporating section, one of the condensing sections passing through a corresponding one of the at least one opening to extend through the fin set, and the other condensing section passing through a corresponding one of the cutoffs or a corresponding another one of the at least one opening to extend through the fin set.

2. The heat dissipation device of claim 1, wherein the fin set further comprises at least two supporting units, and each supporting unit comprises a plurality of sheets perpendicular to and located between the base and the fins.

3. The heat dissipation device of claim 1, further comprising a fin cover, the fin cover comprising a top panel placed on the fin set and two sidewalls extending downwardly and perpendicularly from two opposite ends of the top panel, the top panel defining a locking aperture therein, the sidewalls each comprising a fixing leg attached to a lateral side of the base.

4. The heat dissipation device of claim 3, further comprising a fan holder, the fan holder comprising a fixing arm extending perpendicularly from an upper edge thereof, the fixing arm comprising a barb extending downwardly from a bottom surface thereof and engaging in the locking aperture.

5. The heat dissipation device of claim 4, wherein the fan holder forms at least one inhibiting tab at a lower edge thereof, the at least one inhibiting tab engaged in the supporting frame of the base.

6. The heat dissipation device of claim 5, further comprising a fan mounted to the fan holder by a plurality of fixtures, the fan generating an airflow through the fin set to dissipate heat of the fin set absorbed simultaneously from the at least two heat-generating electronic components.

7. A heat dissipation device for at least two heat-generating electronic components, comprising:
   a base comprising a supporting frame, the supporting frame comprising at least two spaced bridges and at least two plates attached to a bottom of the at least two bridges for contacting the at least two heat-generating electronic components;
   a fin set comprising a plurality of fins horizontally arranged on the base;
   at least two groups of heat pipes with each heat pipe comprising an evaporating section sandwiched between one of the at least two bridges and one of the at least two plates, and at least one condensing section extending through the fin set;
   a fin cover comprising a top panel placed on the fin set and two sidewalls extending downwardly and perpendicularly from two opposite ends of the top panel, the top panel defining a locking aperture therein, and the sidewalls each comprising a fixing leg attached to a lateral side of the base; and
   a fan holder comprising a fixing arm extending perpendicularly from an upper edge thereof, the fixing arm comprising a barb extending downwardly from a bottom surface thereof and engaging in the locking aperture.

8. The heat dissipation device of claim 7, wherein a bottom surface of each of the at least two bridges of the base and a top surface of each of the at least two plates respectively define receiving grooves which cooperatively form receiving channels for receiving the evaporating sections of the heat pipes.

9. The heat dissipation device of claim 7, wherein each group of the heat pipes comprises three U-shaped heat pipes.

10. The heat dissipation device of claim 8, wherein the fin set further comprises at least two supporting units, each supporting unit comprising a plurality of sheets perpendicular to the base and standing on the at least two bridges of the base, respectively.

11. A heat dissipation device comprising:
   a heat sink comprising:
      a base comprising at least two separate plates adapted for respectively thermally connecting at least two heat-generating electronic components simultaneously; and
      a fin set thermally connecting with the base to absorb heat from the base absorbed from the at least two heat-generating electronic components;
   a fin cover comprising a top panel placed on the fin set and two sidewalls extending downwardly and perpendicularly from two opposite ends of the top panel, the top panel defining a locking aperture therein, and the sidewalls each comprising a fixing leg attached to a lateral side of the base;
   a fan holder comprising a fixing arm extending perpendicularly from an upper edge thereof, the fixing arm comprising a barb extending downwardly from a bottom surface thereof and engaging in the locking aperture; and
   a single fan attached to the fan holder for generating an airflow through the fin set to dissipate the heat in the fin set to a surrounding environment.

12. The heat dissipation device of claim 11, wherein the fan holder comprises at least one tab fitting downwardly into the base.

13. The heat dissipation device of claim 11, further comprising a plurality of heat pipes thermally connecting the base and the fin set.

14. The heat dissipation device of claim 11, further comprising at least two groups of heat pipes respectively connecting the at least two plates to the fin set.

15. The heat dissipation device of claim 14, wherein the supporting frame further comprises at least two spaced bridges, the at least two plates are respectively attached to bottoms of the at least two bridges, and the supporting frame defines at least one opening between the at least two bridges and two cutoffs beside the at least two bridges, respectively.

16. The heat dissipation device of claim 15, wherein the heat pipes each are U-shaped, each heat pipe comprises an evaporating section sandwiched between one of the at least two plates and a corresponding bridge and two condensing sections extending from two opposite ends of the evaporating section, one of the condensing sections passing through a corresponding one of the at least one opening to extend through the fin set, and the other condensing section passing through a corresponding one of the cutoffs or a corresponding another one of the at least one opening to extend through the fin set.

* * * * *